United States Patent [19]
Tamura

[11] Patent Number: 4,600,601
[45] Date of Patent: Jul. 15, 1986

[54] PROCESS OF COATING THE SURFACE OF A BOARD

[75] Inventor: Kazuyoshi Tamura, Okazaki, Japan
[73] Assignee: Aisin Seiki Kabushikikaisha, Japan
[21] Appl. No.: 744,726
[22] Filed: Jun. 14, 1985
[30] Foreign Application Priority Data Jun. 14, 1984 [JP] Japan .................. 59-122808

[51] Int. Cl.⁴ ............................. B05D 5/12
[52] U.S. Cl. ..................... 427/96; 118/323; 427/346; 427/348; 427/420; 427/421; 427/424; 427/345
[58] Field of Search ............... 427/346, 348, 420, 424, 427/421, 96, 345; 118/323

[56] References Cited

U.S. PATENT DOCUMENTS 3,468,099  9/1969  Vogt .................................... 427/420
4,259,377  3/1981  Baize ................................... 427/420

FOREIGN PATENT DOCUMENTS 0145648  9/1984  European Pat. Off. ............ 427/420

Primary Examiner—John D. Smith
Assistant Examiner—Janyce A. Bell
Attorney, Agent, or Firm—Sughrue, Mion, Zinn, Macpeak and Seas

[57] ABSTRACT

A process of insulatingly coating a front and a back surface of a printed circuit board is disclosed. A vessel has a large top opening for receiving coating liquid therein and has a plurality of small apertures formed in the bottom. The vessel is immersed into a pool of coating liquid contained in a reservoir for injection of coating liquid into the vessel. The vessel is pulled upward from the reservoir before a printed circuit board reaches the location of the vessel, whereby a coating liquid flows down through the plurality of apertures in the vessel as series of continuous thin streams in the form of strings. A printed circuit board disposed at an angle is fed through the shower thus formed. After passing through the shower, the board is pivotally driven to present a surface which has previously been facing downward upward, and the board is again fed in an inclined position through the shower. The coating liquid on the front and the back surface is allowed to be drained off the board, which is then fed to a drying stage where an air stream is directed upward toward the board from the downside thereof, and the board is angularly driven about a horizontal axis.

9 Claims, 11 Drawing Figures drying air

PROCESS OF COATING THE SURFACE OF A BOARD

BACKGROUND OF THE INVENTION

The invention relates to the provision of a coating or a thin layer on the surface of a board, in particular, to form an insulative coating on the front and back surfaces of a printed circuit board.

A variety of coatings are applied to the surfaces of many different boards in a number of industrial fields. For example, a printed circuit board carrying printed electrodes to which various electrical components are soldered has its front and back surfaces coated with an insulating, humidity-resistant paint. A conventional coating process comprises the steps of dipping a printed circuit board into a pool of insulating, humidity-resistant paint liquid, pulling the board up from the pool, and allowing an excess amount of liquid paint to be drained by dripping off the board, followed by a drying step. Alternatively, such liquid paint may be sprayed onto the printed circuit board, which is then dried up.

If the coating process in which the printed circuit board is dipped into the liquid paint is used, it is possible that the liquid paint may find its way into the housings of electrical components carrying electrical contacts or mechanically moving parts such as connectors, relays, buzzers or like to provide an insulating film over the contacts or to lock the moving parts against movement. Accordingly, a portion of the circuit board which carries these electrical components is prevented from being immersed into the liquid paint. Specifically, any location on the board which should be prevented from being immersed into the liquid paint is separately coated by brushing or liquid injection with a liquid syringe. It will thus be seen that such technique results in an increased number of processing steps and is also likely to produce an uneven coat layer. Where the liquid paint is sprayed onto the printed circuit board to provide a coating thereon, either the duration of the spraying operation or the flow rate of sprayed liquid must be increased in order to assure that the paint be satisfactorily sprayed into areas located between the limbs of the electrical components. This results in an increase in the paint mist which is diffused into the air or the surrounding environment, requiring a significant installation for the recovery of paints from the air. In addition, the spraying operation causes the solvent used in the liquid paint to be dispersed to result in an increase in the concentration of paints which are being recovered. Accordingly, it will be seen that an increased cost is involved in adjusting the concentration of the paint, in dealing with the solvent dispersed and assuring the environment of a coating stage against contamination.

SUMMARY OF THE INVENTION

It is a first object of the invention to provide a coating process in which the diffusion of a solvent from a coating liquid is reduced. It is a second object of the invention to provide a coating process which requires a reduced number of steps. It is a third object of the invention to provide a coating process which prevents a liquid paint from finding its way into a housing of an electrical component which includes mechanically moving parts.

The above objects are achieved in accordance with the invention by the use of a vessel for a coating liquid which has a relatively large top opening and a plurality of relatively small apertures formed in the bottom thereof. The vessel is disposed above a reservoir which contains a quantity of coating liquid and is movable up and down. The vessel is normally driven downward to be immersed into the coating liquid which is received within the reservoir. The vessel is pulled or raised upwardly before a board to be coated reaches the location of the coating vessel so as to define a space between the level of the coating liquid within the reservoir and the vessel to permit the board to move thereinto. A coating liquid or a liquid paint flows down through the apertures formed in the bottom of the vessel as a number of continuous string-shaped streams, thereby forming a shower. The board is fed into the shower in an inclined position with respect to the horizontal plane with its first side facing upward. Alternatively, the vessel may be fed over the board to apply a shower thereto.

In a preferred embodiment, the plurality of small apertures are formed in the bottom of the vessel over a given length crosswise of the board, and are distributed in a manner such that there is no aperture over the board where an electrical component including mechanically moving parts is located.

The liquid in the shower impinges upon the first side of the board which faces upwardly and spreads along the board surface to reach the limbs of the electrical component. If the electrical component has a size and configuration which is large enough to prevent the impinging liquid on the first side from reaching the limbs thereof or where there is no apertures over an extensive area of the vessel bottom, the vessel is rocked in the direction of array of apergures or crosswise of the board when the component is not located directly below the apertures. It will thus be seen that the coating liquid which impinges upon the first side while avoiding its direct impingment upon the electrical component flows along the first side and spreads to reach the limbs of the component.

After the board has moved below the vessel, it is driven for pivotal movement so that a second side of the board faces upward while the first side to which the coating liquid is applied is located on the backside, and the board is again controlled to an inclined position. The board is then driven in the reverse direction, or the vessel containing the coating liquid may be driven in the reverse direction, thereby applying the coating liquid to the second side. Subsequently, the board is left stationary over the reservoir to allow a gravitational flow and dripping off of the coating liquid applied to the first and the second side thereof. The board may be driven for rotation in order to accelerate the flow of any excess amount of liquid during the time it remains over the reservoir. After the excess liquid has flown down the board, the latter is fed to a drying stage where an air stream is directed to the board from down to upward.

In another embodiment of the invention, a pair of vessels containing the coating liquid are disposed over the reservoir, and the board to be coated is fed in a direction from a first one to a second one of the vessels. The first vessel is pulled upward from its immersion within the liquid contained in the reservoir before the board reaches the location of the first vessel, and the board is then fed to pass below the first vessel, in an inclined position with its first side facing upward. As the board passes below the first vessel, a first shower therefrom is applied to the first side of the board. After having passed below the first vessel, the board is then angularly driven to face its second side upward, and is fed to pass below the second vessel while maintaining its inclined position. The second vessel is pulled upward from its immersion within the liquid in the reservoir before the board reaches such vessel. As the board moves below the second vessel, a second shower is applied to the second side of the board. The board is then left stationary during a time interval which is sufficient to allow any excess amount of liquid to flow down and become removed from the first and the second side, followed by a shift to a drying stage.

When coating a printed circuit board, it should be noted that a variety of electrical components are present on the front surface thereof while the back surface is provided with soldered points. In a preferred embodiment of the invention, the printed circuit board is moved at a relatively low speed through the shower of coating liquid to assure a satisfactory diffusion or reach-through of the liquid to the limbs of the components when coating the front surface of the board while the printed circuit board is moved at a relatively high speed through the shower when coating the back surface since the coating liquid diffuses rapidly.

At any rate, it will be seen that one side of the board is coated by moving the board below the vessel or moving the vessel over the board, while reducing the number of steps required. Since the coating liquid impinges upon the board by a gravitational flow, a dispersion or evaporation of an increased amount of coating liquid or solvent, which is experienced in the conventional spray coating process, is avoided, thus reducing the installation cost which is required to recover the coating liquid and to adjust the concentration thereof. If electrical components having electrical contacts or mechanically moving parts are mounted on the board, a single wetting step is sufficient to produce a coating which extends to limbs of these components while preventing the electrical contacts or moving parts from being directly coated. During an idle time when the board is not conveyed to the vessel or while the coating step is quiescent, the apertures formed in the bottom of the vessel to define a shower are prevented from being plugged by merely immersing it into the pool of coating liquid in the reservoir.

Other objects and features of the invention will become apparent from the following description of several embodiments thereof with reference to the drawings.

DESCRIPTION OF EMBODIMENTS

Figure 1:
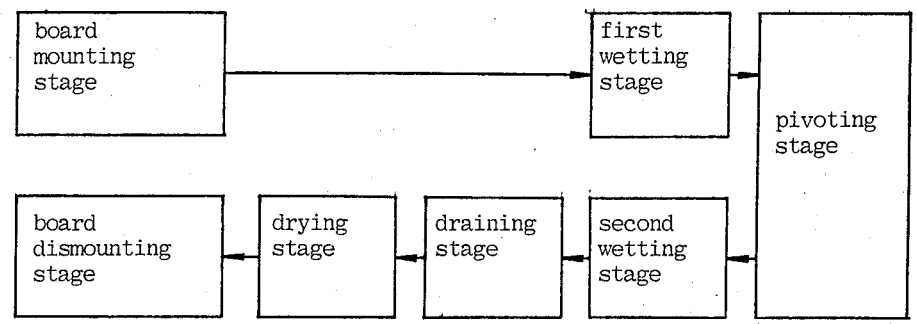
FIG. 1 is a block diagram indicating the direction of movement of a printed circuit board combined with processing steps according to a first embodiment of the invention.

Referring to FIG. 1, there is schematically shown the process of the invention according to a first embodiment thereof. As shown, a printed circuit board is mounted on a holder at a board mounting stage 10, and the holder is fed to a first wetting stage 20 where a vessel containing a quantity of coating liquid is located. At stage 20, a coating liquid is applied to a first side of the printed circuit board. The board is then fed from the stage 20 to a pivoting stage 30 where it is brought to a stop and is driven for pivotal motion. Subsequently, it is fed in the reverse direction until a second wetting stage 40 is reached where a coating liquid is applied to a second side of the board. The board is then fed to a draining stage 50 where it remains stationary for a given time interval. Subsequently, the board is fed to a drying stage where it is exposed to an air stream. At drying stage 60, the board remains stationary and is then driven for pivotal motion. Finally, the board is fed to a board dismounting state 70 where it is dismounted from the holder. It is to be noted that the board dismounting stage 70 is located at the same position as the board mounting stage 10, and that the second setting stage 40 is located at the same position as the first wetting stage 40. The pivoting stage 30 is a point for reversal where the printed circuit board which has been fed from left to right is brought to a stop and then fed from right to left.

Figure 2:
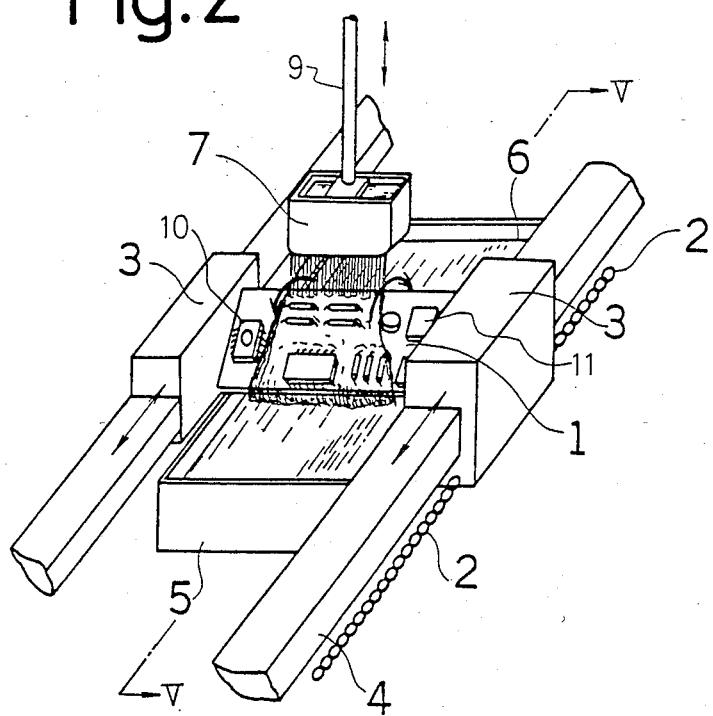
FIG. 2 is a perspective view of an arrangement used in the invention, particularly illustrating the relationship between a printed circuit board and a shower of coating liquid which is used during the wetting step of the first embodiment.

Referring to FIG. 2 which schematically shows an equipment used in carrying out the process of the first embodiment, a pair of parallel guide rails 4 are disposed above a reservoir 5 which contains a quantity of coating liquid. Each of the guide rails 4 carries a holder 3 which is in turn connected through a chain 2 to a reciprocatory drive, not shown, so as to be driven back and fourth along the guide rail 4. While not shown, it is to be understood that each holder 3 includes a clamp, not shown, which is used to hold a printed circuit board 1 as well as a rotary mechanism, also not shown, which causes the clamp to rotate. A vessel 7 which is adapted to contain a coating liquid is secured to the lower end of a rod 9, the upper end of which is coupled to a vertical reciprocatory drive, not shown, so that the rod 9 may be driven between an upper position shown in FIG. 2 and a lower position shown in FIG. 8. The vessel 7 has a large top opening, whereby when the vessel 7 is driven to its lower position shown in FIG. 8, the coating liquid contained within the reservoir 5 can enter the vessel 7 rapidly through the top opening.

Figure 3:
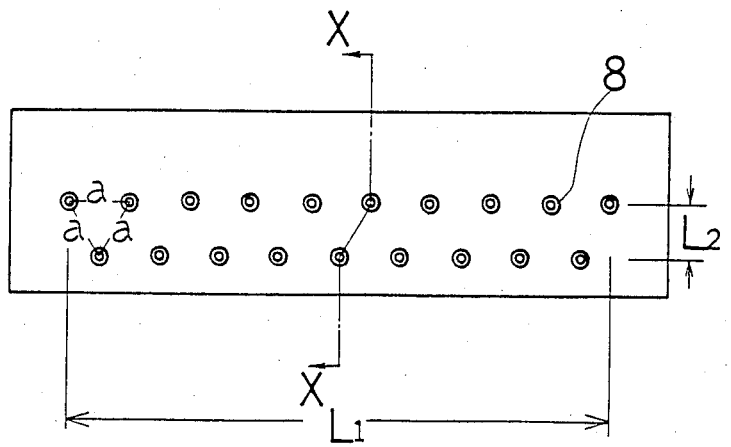
FIG. 3 is a bottom view of a vessel shown in FIG. 2.

As shown in FIG. 3, a plurality of small apertures 8 are formed in the bottom of the vessel 7. These apertures 8 are formed by a punch operation, punching through the bottom from the inside to the outside of the vessel 7. Alternatively, a nozzle sleeve including small apertures may be fixedly connected to the vessel 7. As shown, the apertures 8 are disposed in a pair of rows with a spacing $L_2$ therebetween. Adjacent apertures are spaced apart a distance a. It is to be noted that an array of apertures 8 extends crosswise of the printed circuit board or from right to left, as viewed in FIG. 2, and the array of apertures 8 has a length $L_1$ over which the apertures are distributed.

As shown in FIG. 2, the printed circuit board 1 is shown as including an IC element 10 which includes a memory erase window disposed along the left-hand edge of the board 1, and a relay 11 disposed along the right-hand edge of the board 1. In this instance, the small apertures 8 are distributed so that a shower of coating liquid is applied to the board only over a length $L_1$ between the IC element 10 and the relay 11. Accordingly, the shower of coating liquid impinges upon the board only over the length $L_1$ located between the left and right edges thereof on both the front and the back side, but the coating liquid applied to the board 1 spreads to the left and the right edge of the board 1. In other words, the liquid spreads to a sufficient degree to cover the required area to be coated. To accomodate for the possibility that the liquid may not spread to cover the required area, the holders are provided with a printed circuit board rocking mechanism. In this instance, the printed circuit board is subject to a laterial oscillation or rocking motion until both the IC element 10 and the relay 11 move to a location directly below the apertures 8, and the rocking motion of the board is interrupted during the time the element 10 and the relay 11 remain below the apertures 8. After the element 10 and the relay 10 have moved out of a region below the apertures 8, the printed circuit board 1 is again subject to a lateral oscillation. As a result of utilizing such manner of operation, the coating liquid which impinges upon the inclined surface of the board 1 at a location upward of the IC element 10 and the relay 11 flows down the inclined surface to reach the limbs of the IC element 10 and the relay 11.

Figure 4:
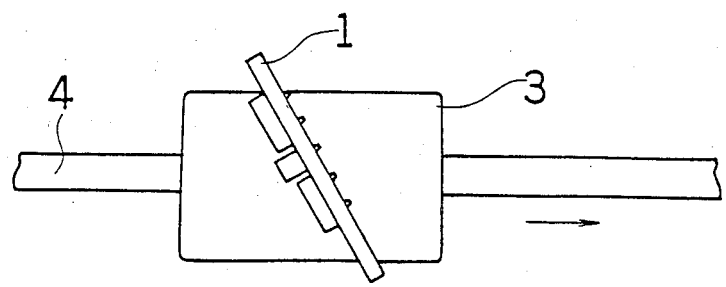
FIG. 4 is a transverse section illustrating the mounting of board onto a holder at a board mounting stage of the first embodiment.
Figure 5:
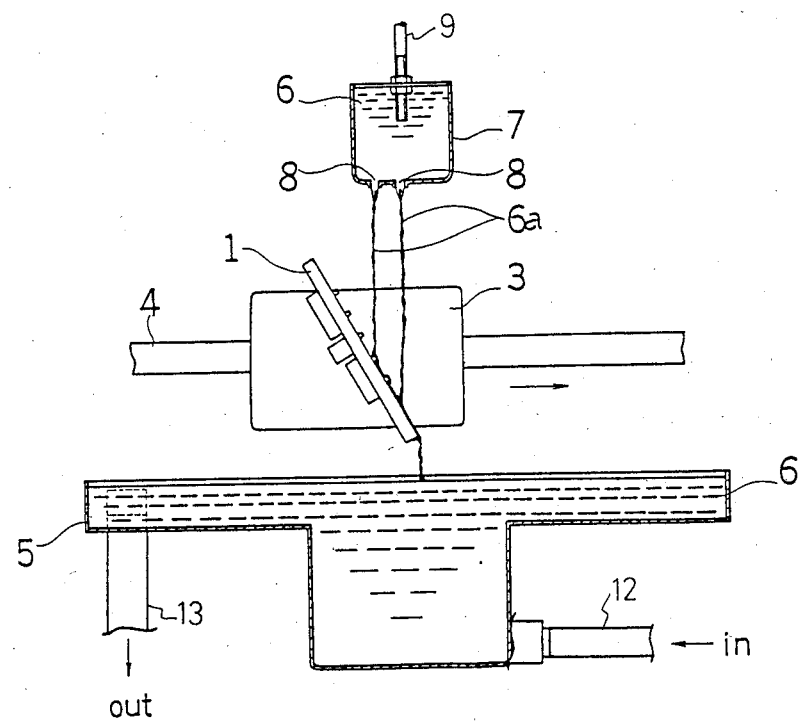
FIG. 5 is a cross section taken along the line V—V shown in FIG. 2, illustrating the relationship between the shower of coating liquid and the board at a first wetting stage of the first embodiment.
Figure 6:
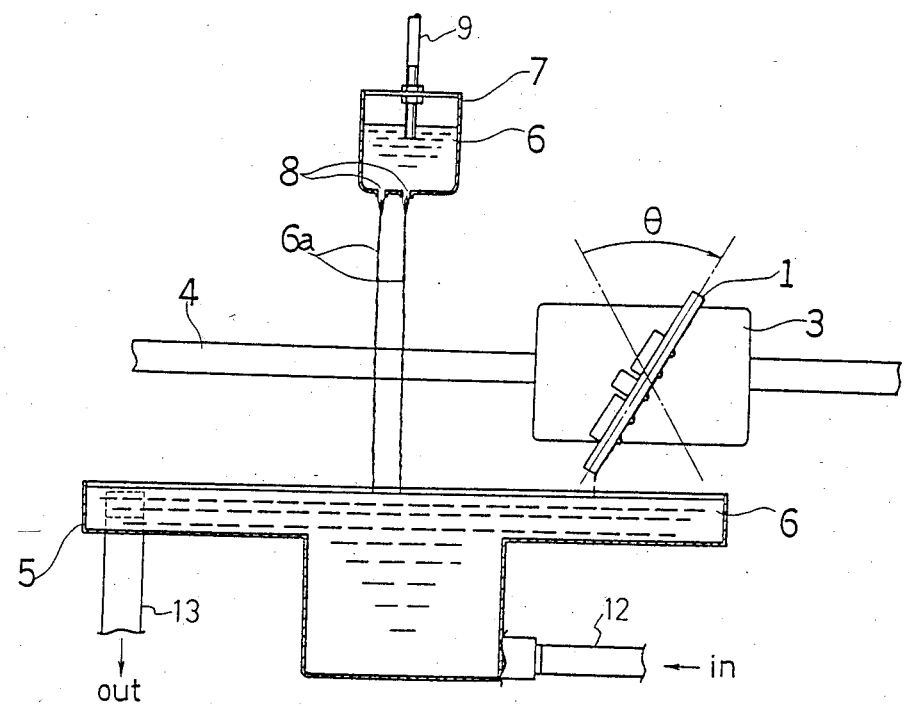
FIG. 6 is a similar cross section taken along the line V—V shown in FIG. 2, illustrating the relationship between the shower and the board at a pivoting stage of the first embodiment.
Figure 7:
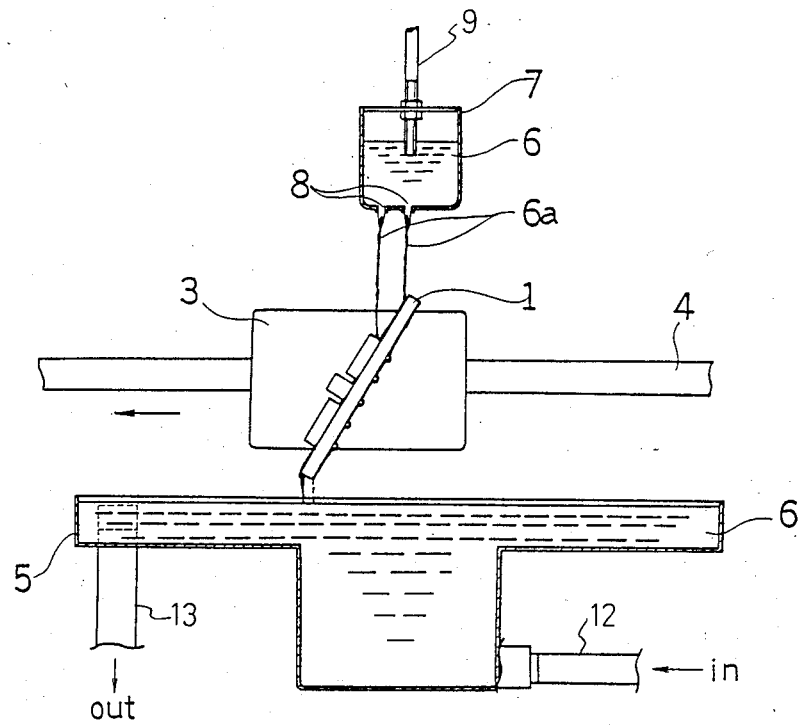
FIG. 7 is a similar cross section taken along the line V—V shown in FIG. 2, illustrating the relationship between the shower and the board at a second wetting stage of the first embodiment.
Figure 8:
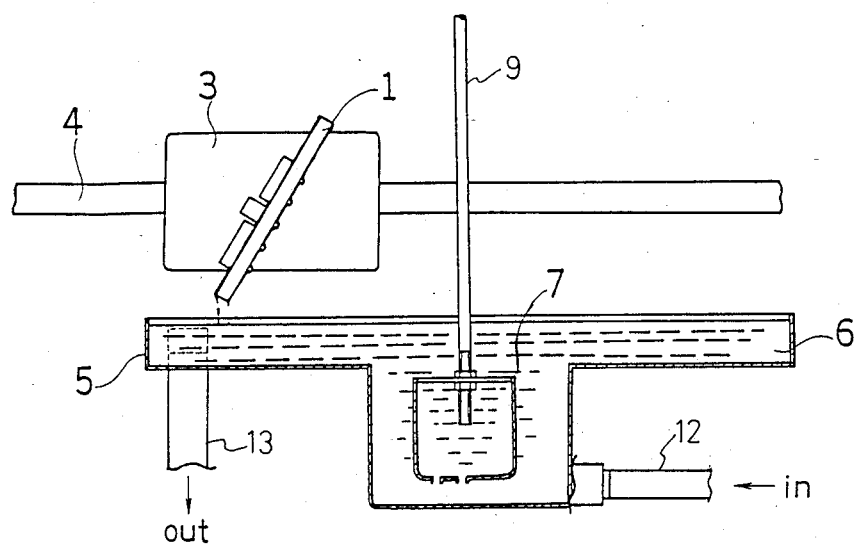
FIG. 8 is a similar cross section ataken along the line V—V shown in FIG. 2, illustrating the location of the board at a draining stage of the first embodiment.
Figure 9:
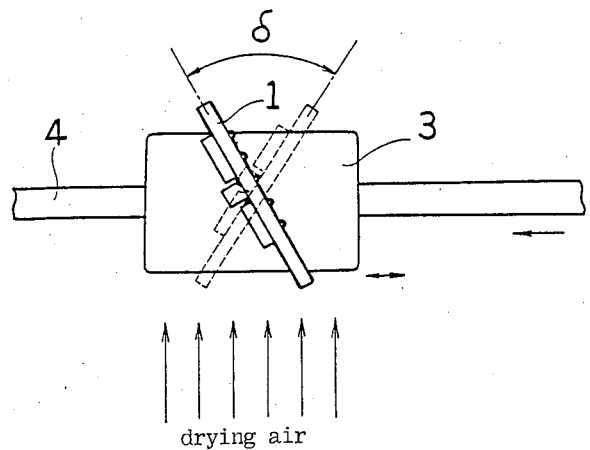
FIG. 9 is a transverse section of the board at a drying stage of the first embodjment.

FIG. 5 shows the reservoir 5 containing a quantity of coating liquid, and it is to be understood that the board mounting stage 10 shown in FIG. 1 is located to the left of the reservoir 5 shown in FIG. 5. The printed circuir board 1 is mounted on the holders 3 at the stage 10 so as to assume an inclined position with respect to the horizontal plane as indicated in FIG. 4. The board 1 is driven to the right together with the holders 3 while maintaining such position. When the board 1 is driven to the right and has travelled through a given distance, the rod 9 is driven upward, whereby the vessel 7 is raised from its lower position shown in FIG. 8 to its upper position shown in FIG. 5. The coating liquid then flows down through small apertures 8 formed in the bottom of the vessel 7 as series of continuous thin strings, thus forming a shower of coating liquid. As the board 1 advances into the first wetting stage 20, it moves into the shower 6a as shown in FIG. 5, whereby the first side of the board which represents a soldering surface is exposed to the shower 6a in a manner illustrated in FIG. 2. When the board 1 has moved through the first wetting stage or the shower 6a, it continues to move in the same direction through a given distance until the pivoting state 30 is reached. When it reaches the stage 30, the holders are brought to a stop, and the board 1 is driven clockwise through an angle $\theta$ as indicated in FIG. 6. The holders 3 are then driven from right to left to feed the printed circuit board 1 into the second wetting stage 40. As shown in FIG. 7, a second side of the printed circuit board 1 on which the electrical components are mounted moves into the shower 6a at the second wetting stage 40. After having passed through the shower 6a, the board 1 is left stationary over the reservoir 5 as indicated in FIG. 8. This represents the draining stage 50 where the board 1 remains stationary for a given time interval during which any excess amount of coating liquid remaining on the front and the back surface of the board 1 flows down into the reservoir 5. To accelerate the flow of such liquid, the board 1 may be rotated in one direction or may be oscillated through a given angle. After the board 1 has moved through the shower, 6a, the rod 9 is driven to its lower position, whereby the vessel 7 is immersed into the coating liquid. After the board has been left stationary for the given time interval, the holders 3 are driven to the drying stage 60 which is located to the left of the reservoir 5 where they are stopped again. As shown in FIG. 9, a stream of drying air is blown upward as indicated in FIG. 9, to impinge upon the board 1. The board 1 is oscillated through an angle $\delta$ and the holders 3 are also driven for reciprocatory motion over a small stroke. The combination of the angular oscillation of the board 1 and the reciprocatory motion of the holders 3 allows both the front and the back surface of the board 1 to be alternately exposed to the air stream, whch also flows past the limbs of the electrical components carried by the board 1. In this manner, a uniform impingement of the air stream upon the various parts of the board 1 is assured. After a given time interval, the holders 3 are driven to the board dismounting stage 70 where they stop. It should be understood that the stage 70 is located at the same position as the stage 10, and the printed circuit board 1 is disengaged from the clamps on the holders 3 at stage 70. Another printed circuit board which is to be coated may then be mounted on the holders 3.

The reservoir 5 has an inlet port 12 through which a liquid paint, the concentration of which is adjusted to a given value, is supplied from a source, not shown. Any liquid paint which exceeds a given liquid level within the reservoir 5 overflows through a discharge port 13 to be returned to the source. The recovered liquid paint is added with a fresh liquid paint and a solvent in the source to adjust the concentration to a given value, whereupon it is supplied through the inlet port 12.

Figure 10:
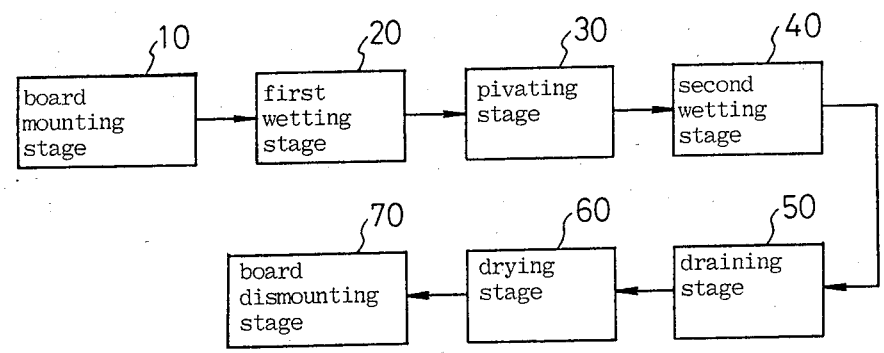
FIG. 10 is a block diagram showing the direction of movement of a printed circuit board combined with processing stages of a second embodiment of the invention.

Referring to FIG. 10 which illustrates a second embodiment of the invention, a printed circuit board is fed from a board mounting stage 10 to a board dismounting stage 70 by a rightward movement or clockwise movement alone. A holder which is used in this embodiment to hold the printed circuit board is mounted on a pair of concentric annular rails, and is moved along the rails from the board mounting location 10 through stages 20 to 60 to the board dismounting stage 70, whereupon it is advanced from the stage 70 to the board mounting stage 10. A single vessel which contains a quantity of coating liquid and constructed in the same manner as the vessel 7 mentioned above is disposed at each of a first and a second wetting stage 20, 40. Thus, the equipment which is used to carry out the coating process includes a first and a second vessel and a drive which separately drives these vessels to their lower and upper positions. In other respects, the equipment is similar to that used to carry out the process of the first embodiment mentioned above.

Specifically, the printed circuit board is mounted on a holder at the board mounting stage 10, and is then fed to the first wetting stage 20. At the first wetting stage 20, the first vessel is driven from its lower to its upper position before the board reaches this stage, thus forming a shower of coating liquid. The board is advanced into the first wetting stage 20 at a given speed and moves therethrough at a given speed. After the board has moved past it, the first vessel of the first wetting stage 20 is driven to its lower position. After having passed through the first stage 20, the board is fed to the second wetting stage 40 while it is clockwise pivoted through an angle δ (pivoting stage 30). The second vessel of the second wetting stage 40 is driven from its lower to its upper position before the board reaches this station, thus forming a shower. The board is advanced into the second wetting stage 40 at a given speed and moves therethrough at a given speed. After the board has passed therethrough, the second vessel of the second wetting stage 40 is driven to its lower position. After having passed through the second wetting stage 40, the board is left stationary for a given time interval to remain over the reservoir 5 (draining stage 50). After such time interval, the board is again driven clockwise and stops after passage over the reservoir 5, at a drying stage 60 where an air streams blown upward from the downside. At drying stage 60, the board is oscillated through an angle δ and the holder is also driven for reciprocatory motion over a reduced stroke. After a given number of oscillations, the board is again driven clockwise to reach the board dismounting stage 70 where its motion is stopped. The board is then dismounted from the holder, which is then driven further clockwise to reach the board mounting stage 10 where it comes to a stop.

Figure 11:
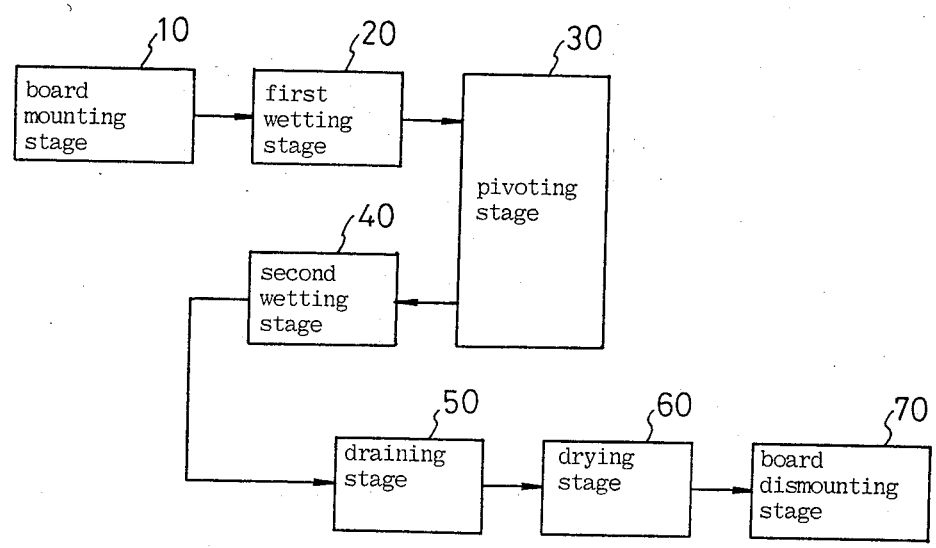
FIG. 11 is a block diagram showing the direction of movement of a printed circuit board combined with processing stages of a third embodiment of the invention.

Referring to FIG. 11 which illustrates a third embodiment of the invention, a printed circuit board is fed from a board mounting stage 10 to a board dismounting stage 70 by a rightward or clockwise movement. A holder which is used to hold a printed circuit board is mounted on a pair of concentric annular rails, and moves from the board mounting stage 10 through stages 20 to 60 to the board dismounting stage 70 by a clockwise movement. After the holder has reached the stage 70, it is advanced to the board mounting stage 10. It is to be understood that a first wetting stage 20 and a second wetting stage 40 are located at the same position, and a single vessel which contains a quantity of coating liquid is used in common in the both stages 20 and 40, this vessel being constructed similarly as the vessel 7 mentioned above. Thus, in the third embodiment, when the board has moved past the first wetting stage 20 and reaches the pivoting stage 30, it is then fed in the reverse direction to move through the second wetting stage 40, in the same manner as in the first embodiment, and subsequently, it is fed clockwise to a draining stage 50. In other respects, the arrangement is similar to that mentioned above in connection with the second embodiment.

Specifically, a printed circuit board is mounted on a holder at the board mounting stage 10, and is fed to the first wetting stage 20. The vessel of the first wetting stage 20 is driven from its lower to its upper position before the board reaches this stage, thus forming a shower of coating liquid. The board is advanced into the first wetting stage 20 at a given speed and moves therethrough at a given speed. The vessel remains at its upper position. After having moved past the first wetting stage 20, the board is stopped at the pivoting stage 30 where it is angularly driven through an angle θ, and the board is then fed in the counter-clockwise direction to move through the second wetting stage 40 or below the vessel which then remains at its upper position. The movement of the board is then stopped, and the board is then fed clockwise to move below the vessel toward the draining stage 50. After the board has moved below the vessel, the vessel is driven to its lower position. The board is left stationary over the reservoir 5 for a given time interval, at draining stage 50. After such time interval, the board is again driven clockwise and its motion is stopped after it has moved over the reservoir 5. The position where the board now stops represents a drying stage 60 where an air stream is blown upward from the downside. At this stage, the board is oscillated through an angle δ and the holder is driven for reciprocatory motion through a reduced stroke. After a given number of oscillations, the board is again driven clockwise to reach the board dismounting stage 70 where it comes to a stop. The board is then dismounted from the holder and the holder is then further driven clockwise to reach the board mounting stage 10 where it comes to a stop.

Having described preferred embodiments of the invention, modifications will be evident to those skilled in the art without departing from the scope of the invention as defined by the appended claims.

What is claimed is:

1. A process of coating the surface of a board comprising:
    a liquid introducing step of providing a vessel adapted to contain a quantity of coating liquid and having a relatively large top opening and having a plurality of relatively small apertures formed in the bottom thereof and immersing the vessel into a pool of coating liquid in a reservoir;
    a liquid lifting step of pulling the vessel upward from the coating liquid of the reservoir;
    and a first wetting step of causing a flow of coating liquid which passes through the plurality of relatively small apertures in the bottom of the vessel to impinge upon a board by moving one of the board and the vessel relative to the other, the board being located above the liquid surface and below the vessel at an angle with respect to the plane defined by the liquid level within the reservoir.

2. A process of coating the surface of a board according to claim 1 in which the plurality of apertures are distributed over the board or the vessel in a direction transverse to the direction of movement during the first wetting step.

3. A process of coating the surface of a board according to claim 2, further comprising:
    a pivoting step of pivotally moving the board to present the back surface, which is opposite from the surface that is presented to the liquid level during the first wetting step, to the liquid level of the reservoir at an angle thereof;
    and a second wetting step of causing a flow of coating liquid through the plurality of apertures to impinge upon the board by moving one of the board and the vessel relative to the other in the opposite direction from the direction in which it is moved during the first wetting step.

4. A process of coating the surface of a board according to claim 3, further comprising:
   a draining step which follows the second wetting step to drain the coating liquid off the board by a gravitational flow;
   and a drying step of directing an upward air stream to the board from the downside thereof.

5. A process of coating the surface of a board according to claim 4 in which the drying step includes pivotally moving the board to direct the air stream against both the front and the back surface of the board.

6. A process of coating the surface of a board comprising:
   a first liquid introducing step of immersing into a pool of coating liquid contained in a reservoir a first vessel having a relatively large top opening and having a plurality of relatively small apertures formed in the bottom thereof;
   a first liquid lifting step of pulling the first vessel upward from the coating liquid of the reservoir;
   a first wetting step of causing a flow of coating liquid through the plurality of apertures formed in the bottom of the first vessel to impinge upon a board by causing the board which is disposed at an angle with respect to the liquid level of the coating liquid in the reservoir to move through a space between the first vessel and the liquid level;
   a pivoting step of pivotally moving the board to present a back surface of the board, which is opposite from the surface presented to the liquid level during the first wetting step, to the liquid level of the reservoir at an angle with respect thereto;
   a second liquid introducing step for immersing a second vessel into the coating liquid of the reservoir at least before the board subjected to the pivoting step is brought to the location of the second vessel, the second vessel also having a relatively large top opening and having a plurality of relatively small apertures formed in the bottom;
   a second liquid lifting step of pulling the second vessel upward from the coating liquid of the reservoir at least before the board subjected to the pivoting step reaches the location of the second vessel;
   and a second wetting step of causing a flow of coating liquid through the plurality of apertures in the second vessel to impinge upon the board, by causing the board subjected to the pivoting step to pass through a space between the second vessel and the liquid level of the coating liquid in the reservoir.

7. A process of coating the surface of a board according to claim 6 in which the plurality of relatively small apertures formed in the first and the second vessel are distributed in a direction transverse to the direction of movement of the board during the first and the second wetting step.

8. A process of coating the surface of a board according to claim 7, further comprising:
   a draining step subsequent to the second wetting step for allowing the coating liquid to be drained off the board by a gravitational flow;
   and a drying step of directing an air stream upward to the board from the downside thereof.

9. A process of coating the surface of a board according to claim 8 in which the drying step includes a pivoting step of pivotally moving the board to direct the air stream to both the front and the back surface of the board.

* * * * *